United States Patent [19]
Tamura et al.

[11] Patent Number: 5,336,361
[45] Date of Patent: Aug. 9, 1994

[54] METHOD OF MANUFACTURING AN MIS-TYPE SEMICONDUCTOR DEVICE

[75] Inventors: Akiyoshi Tamura, Suita; Masatoshi Kitagawa, Hirakata, both of Japan

[73] Assignee: Matsushita Electric Industrial Co., Ltd., Osaka, Japan

[21] Appl. No.: 970,991

[22] Filed: Nov. 2, 1992

Related U.S. Application Data

[63] Continuation of Ser. No. 674,067, Mar. 21, 1991, abandoned.

[30] Foreign Application Priority Data

Mar. 23, 1990 [JP] Japan ................................ 2-73711

[51] Int. Cl.⁵ ............................................. H01L 21/02
[52] U.S. Cl. ........................................ 437/42; 437/235; 437/236; 437/237; 437/241; 437/242; 134/1; 117/108; 117/952
[58] Field of Search ............... 437/235, 236, 237, 241, 437/242, 937, 946, 126, 133; 134/142; 427/255.1, 255.2, 255.3; 156/613, 612

[56] References Cited

U.S. PATENT DOCUMENTS

| | | | |
|---|---|---|---|
| 4,436,770 | 3/1984 | Nishizawa et al. | 427/255.3 |
| 4,448,633 | 5/1984 | Shuskus | 437/235 |
| 4,492,620 | 1/1985 | Matsuo et al. | 204/192.12 |
| 4,772,489 | 9/1988 | Shikata | 437/170 |
| 4,859,618 | 8/1989 | Shikata et al. | 437/177 |
| 4,883,686 | 11/1989 | Doehler et al. | 427/38 |
| 4,987,008 | 1/1991 | Yamazaki et al. | 437/228 |

FOREIGN PATENT DOCUMENTS

| | | | |
|---|---|---|---|
| 0269041 | 6/1989 | Fed. Rep. of Germany | 437/236 |
| 0155526 | 12/1981 | Japan | 437/937 |
| 0156760 | 12/1981 | Japan | 437/937 |
| 0214437 | 9/1986 | Japan | 437/237 |
| 0155630 | 6/1989 | Japan | 437/236 |
| 0260827 | 10/1989 | Japan | 437/937 |
| 0082578 | 3/1990 | Japan | 437/937 |

OTHER PUBLICATIONS

Capasso et al., "A Proposed Hydrogenation/Nitridization Passivation Mechanism for GaAs and other III-V Semiconductor Devices, Including InGaAs Long Wavelength Photodetectors", J. Electrochem Soc., vol. 129, No. 4, Apr. 1982, pp. 821-824.

Shikata et al., "Formation of Submicron Silicon-Nitride Patterns by Lift-Off Method Using ECR-CVD", SPIE, vol. 797, Advanced Processing of Semiconductor Devices, 1987, pp. 126-129.

Matsuo et al., "Low Temperature Chemical Vapor Deposition Method Utilizing an Electron Cyclotron Resonance Plasma", Jap. J. Appl. Phy., vol. 22, No. 4, Apr. 1983, pp. L210-L212.

*Primary Examiner*—Olik Chaudhuri
*Assistant Examiner*—Ramamohan Rao Paladugu
*Attorney, Agent, or Firm*—Ratner & Prestia

[57] ABSTRACT

Disclosed is a method of manufacturing an MIS-type semiconductor device having a greatly reduced interface state density. In this method, before the formation of a gate insulating film, the surface of a GaAs substrate is treated with a plasma generated from a gas containing hydrogen and nitrogen or from a gas containing hydrogen and argon, so as to reduce the interface state density. An ECR plasma is used as the plasma, so that the damage caused by the plasma to the GaAs substrate is alleviated. After the surface treatment process, an healing process is performed, which sufficiently removes the damage. During the surface treatment process using the plasma generated from the gas containing hydrogen and nitrogen, a GaN gate insulating film is formed on the surface of the GaAs substrate. The surface treatment process using the plasma generated from the gas containing hydrogen and argon is followed by the process of forming a gate insulating film on the GaAs substrate; the two processes are successively performed within the same apparatus without exposing the GaAs substrate to ambient air.

3 Claims, 7 Drawing Sheets

METHOD OF MANUFACTURING AN MIS-TYPE SEMICONDUCTOR DEVICE

This application is a division of application Ser. No. 07/674,067 filed Mar. 21, 1991 now abandoned.

BACKGROUND OF THE INVENTION

1. Field of the Invention

The present invention relates to a method of manufacturing an MIS (Metal-Insulator Semiconductor)-type semiconductor device, and more particularly relates to a method of manufacturing an MIS-type semiconductor device having a GaAs semiconductor substrate.

2. Description of the Prior Art

For the manufacturing of an MIS-type semiconductor device, a gate insulating film is first formed on a GaAs semiconductor substrate (hereinafter referred to as a "GaAs substrate") and a gate electrode is then formed on the gate insulating film. For the formation of the gate insulating film, a film of $SiO_2$, SiN, AlN, or the like, is directly deposited on the GaAs substrate. Alternatively, the surface of the GaAs substrate is oxidized by plasma oxidation or anodic oxidation to form a gate insulating film thereon.

In the operation of an MIS-type semiconductor device manufactured by a conventional method, however, it is difficult to form an inversion layer in the surface portion of the GaAs substrate. This is because the density of the state generated in the interface (interface state) between the GaAs substrate and the insulating film is high (e.g., $10^{12} cm^{-2}/eV$ or higher). In the surface portion of the GaAs substrate, some positions of Ga in the lattice are occupied by As ($As_{Ga}$) instead of Ga and some positions of As in the lattice are occupied by Ga ($Ga_{As}$) instead of As (such As or Ga atoms in the wrong positions of lattice are called anti-site defect). This causes a high-density state in the surface portion of the GaAs substrate.

Figure 7:
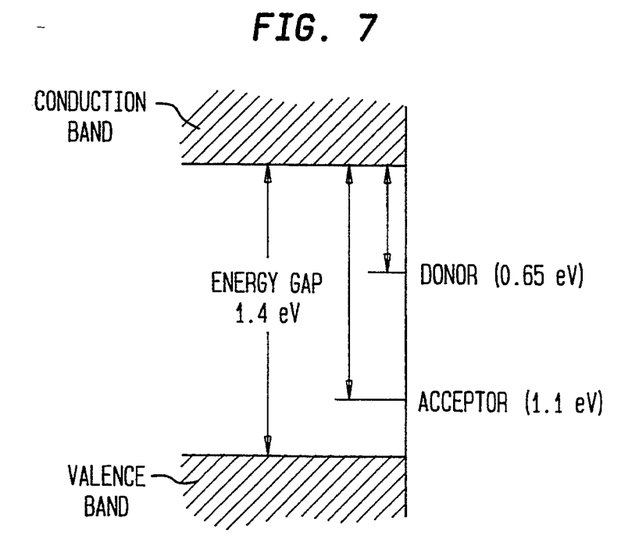
FIG. 7 shows an energy band diagram of a GaAs substrate.

FIG. 7 shows an energy band diagram of the surface portion of a GaAs substrate. The diagram shows the $As_{Ga}$ donor state (energy level of 0.65 eV) caused by As atoms in Ga-sites of the lattice and the $Ga_{As}$ acceptor state (energy level of 1.1 eV) caused by Ga atoms in As-sites of the lattice.

In an MIS-type semiconductor device having an AlGaAs film used as a gate insulating film, there is little possibility that a high-density interface state (surface state) is generated. The interface state density of this MIS-type semiconductor device is as low as that of an MIS-type semiconductor device having a silicon semiconductor substrate. The energy band gap of the gate insulating film made of AlGaAs, however, is not more than about 2 eV, which causes a possibility that the gate insulating film will conduct current when a high bias voltage is applied to the MIS-type semiconductor device.

SUMMARY OF THE INVENTION

The method of manufacturing an MIS-type semiconductor device according to this invention, which overcomes the above-discussed and numerous other disadvantages and deficiencies of the prior art, includes the step of treating the surface of a GaAs substrate with a plasma generated from a gas containing hydrogen and nitrogen.

In a preferred embodiment, the gas containing hydrogen and nitrogen is ammonia gas.

In a preferred embodiment, the plasma is an electron cyclotron resonance (ECR) plasma.

In a preferred embodiment, the step of treating the surface of the GaAs substrate with the plasma includes the formation of a nitride film on the surface of the GaAs substrate.

Another method of manufacturing an MIS-type semiconductor device according to this invention includes the steps of: treating, in a plasma apparatus, the surface of a GaAs substrate with a plasma generated from a gas containing hydrogen end argon; and depositing a gate insulating film on the surface of the GaAs substrate in the plasma apparatus.

In a preferred embodiment, the plasma is an electron cyclotron resonance (ECR) plasma.

Thus, the invention described herein makes possible the objective of providing a method of manufacturing an MIS-type semiconductor device in which the density of the interface state is low.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

In a method of manufacturing an MIS-type semiconductor device according to the present invention, the surface of a GaAs substrate is modified before the formation of a gate insulating film thereon. An apparatus for use in this modification process will be described below with reference to FIG. 1.

Figure 1:
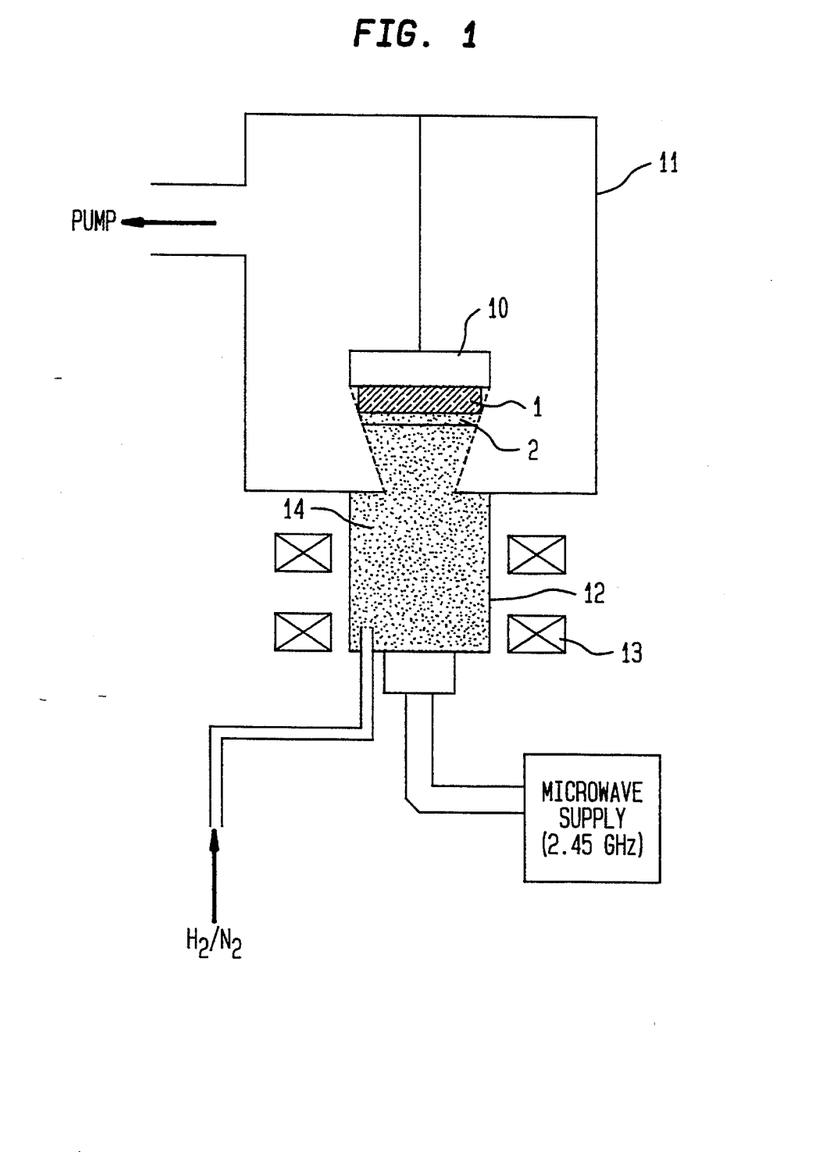
FIG. 1 is a schematic diagram showing an ECR plasma apparatus used for a surface treatment process in a method of the present invention.

FIG. 1 shows an ECR (Electron Cyclotron Resonance) plasma apparatus used for the modification of the suffice of a GaAs substrate. The ECR plasma apparatus has a process chamber 11 in which a GaAs substrate 1 is placed, and also has a plasma chamber 12 which generates an ECR plasma 14 and supplies it into the process chamber 11. In the process chamber 11 is mounted a substrate holder 10 which holds the GaAs substrate 1 in an appropriate position. Magnetic coils 13 are disposed around the plasma chamber 12 so as to generate a magnetic field therein. A 2.45 GHz microwave supply and a microwave oscillator (not shown) generate a microwave, which is directed into the plasma chamber 12.

For the modification of the surface of the GaAs substrate 1, the ECR plasma apparatus is used to perform a surface treatment process as follows: A surface-treatment gas is introduced into the plasma chamber 12, where the gas is exposed to the microwave. The microwave ionizes part of the gas, thereby generating an ECR plasma 14. The ECR plasma 14 is then directed o the GaAs substrate i held on the substrate holder 10. The surface of the GaAs substrate 1 is thus treated with the ECR plasma 14.

The present invention will now be described in detail by reference to the following examples.

Example 1

In this example, as shown in FIG. 1, a mixture of hydrogen and nitrogen gases was introduced into the plasma chamber 12. The ratio of $N_2$ to $H_2$ in the mixture was 9:1. The surface of the GaAs substrate 1 was treated with the ECR plasma 14 generated from the hydrogen-nitrogen mixture. The chambers 11 and 12 were evacuated to $5 \times 10^{-7}$ Torr before the introduction of the hydrogen-nitrogen mixture. During the surface treatment process, the flow rate of the hydrogen-nitrogen mixture was maintained at 10 sccm and the pressure in the chambers 11 and 12 was maintained at $2 \times 10^{-4}$ Torr. The output of the 2.45 GHz microwave was 400 W and the strength of the magnetic field was 875 gausses. The GaAs substrate 1 was kept at about 200° C. during the surface treatment process.

During the surface treatment process, the hydrogen plasma in the ECR plasma 14 caused As atoms to evaporate from the surface of the GaAs substrate 1, while the nitrogen plasma in the ECR plasma 14 nitrided the surface of the GaAs substrate 1, resulting in a GaN film 2 on the surface of the GaAs substrate 1. When the GaAs substrate I was exposed to the ECR plasma 14 for 15 minutes, the thickness of the GaN film 2 formed on the GaAs substrate 1 was about 15 nm. Since the GaN film 2 thus produced has an energy gap of 3.4 eV, it serves as e high-quality gate insulating film of an MIS-type semiconductor device.

Figure 2A:
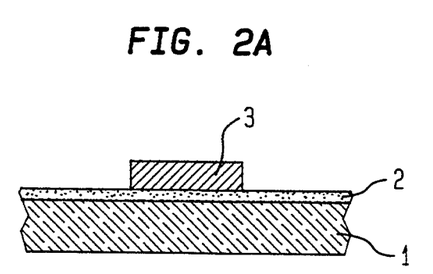
FIGS. 2A to 2C are sectional diagrams showing the steps of manufacturing an MIS-type semiconductor device, taken after the surface treatment process shown in FIG. 1.

After the surface treatment, the GaAs substrate 1 was taken out of the process chamber 11, and a layer of metal having a high melting point was formed on the GaN film 2 using a known sputtering method. Thereafter, by the use of photolithography, the metal layer was formed in a prescribed pattern, resulting in a gate electrode 3 covering a prescribed region of the GaAs substrate 1, as shown in FIG. 2A. As a material for the metal layer, WSi, WSiN, WN, or the like is preferable. When the metal layer is made of one of these materials, it is formed in a prescribed by dry etching, using $CF_4/O_2$ as an etching gas. As a result of the above processing steps, an MIS structure including the gate electrode 3, the GaN film 2 and the GaAs substrate 1 was obtained.

Figure 2B:
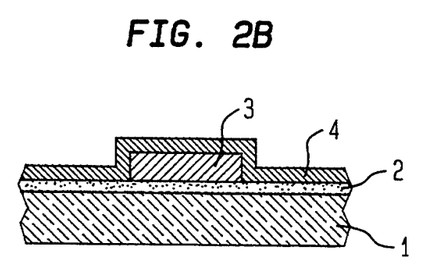
Figure 2C:
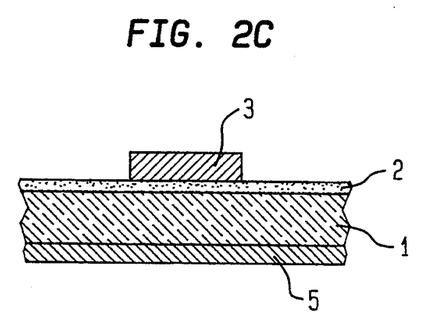

Next, as shown in FIG. 2B, an $SiO_2$ film 4 having 8 thickness of about 50 nm was deposited on the gate electrode 3 and the GaN film 2 by the use of thermal chemical vapor deposition. The GaAs substrate 1 was then annealed in an atmosphere of hydrogen at 500° C. for 15 minutes. As a result, the damage caused by the ECR plasma 14 to the substrate 1 was removed. For the sufficient removal of the damage, the annealing temperature should preferably be in the range of 450° C. to 600° C. The $SiO_2$ film 4 prevents the GaAs substrate 1 and the gate electrode 3 from being oxidized and prevents atoms from evaporating from the GaAs substrate 1, but the provision of the $SiO_2$ film is not essential in a method of the present invention. The $SiO_2$ film 4 was removed using a solution of hydrofluoric acid, after which an ohmic electrode 5 made of AuGe was formed on the back face of the GaAs substrate 1, resulting in an MIS-type semiconductor substrate as shown in FIG. 2C.

As described above, in this example, a gate insulating film (GaN film 2) was formed during the plasma-utilized surface treatment process. In the surface treatment process, As atoms evaporated from the surface of the GaAs substrate 1, and Ga atoms combined with nitrogen atoms to form the GaN film 2, 15 effectively. Thus, the interface between the insulator (GaN film 2) and the semiconductor (GaAs substrate 1) was formed in the bulk GaAs, which resulted in low interface state density.

The surface of the GaAs substrate 1 was not exposed to ambient air until the formation of the GaN gate insulating film 2 was completed, thereby preventing the GaAs substrate 1 from being polluted with the ambient air. Thus, a clean interface was obtained between the GaAs substrate 1 and the GaN gate insulating film 2.

In this example, since the ECR plasma 14 was used for the surface treatment, the damage caused by the plasma to the GaAs substrate 1 was reduced, as compared with cases where other plasmas were used. This is because, when using an ECR plasma, the generation of the plasma and the surface treatment with the plasma were performed in different chambers (in the plasma chamber 12 and in the process (chamber 11, respectively, in this example). Thus, the ECR plasma 14 is suitable for the surface treatment process.

In this example, the mixture of hydrogen and nitrogen gases (with the $N_2$ to $H_2$ ratio of 9:1) was used for the generation of the ECR plasma 14. But other gases can be used so long as they include hydrogen and nitrogen atoms. For example, an ECR plasma generated from ammonia gas can attain the same effect. Furthermore, the gas to be used for the generation of the ECR plasma may contain other gases in addition to hydrogen and nitrogen gases if the amount of the other gases is not so large as to exert adverse effects on the surface treatment process.

Example 2

Figure 3A:
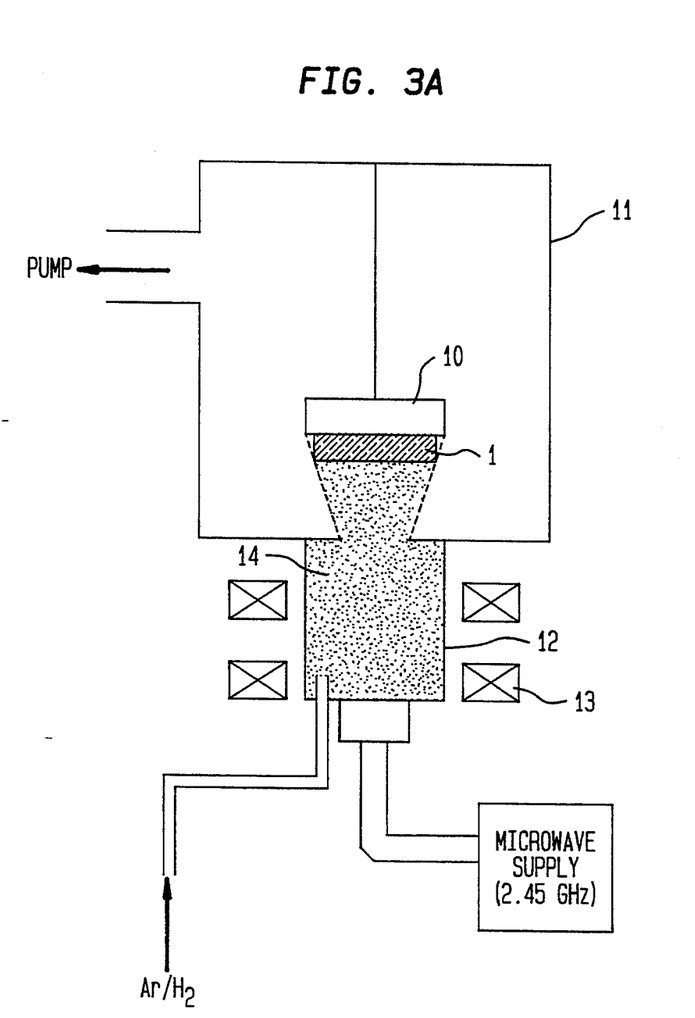
FIG. 3A is a schematic diagram showing the ECR plasma apparatus used for a surface treatment process in another method of the present invention.

FIG. 3A is a schematic diagram showing a surface treatment process performed in accordance with another method of the present invention. The ECR plasma apparatus used in this example was the same as that used in Example 1. The principal difference between Examples 1 and 2 was in the kind of gas used for the generation of the ECR plasma. In this example, as shown in FIG. 3A, a mixture of argon and hydrogen gases was introduced into the plasma chamber 12, where an ECR plasma 14 was generated from the argon-hydrogen mixture, and directed onto the GaAs substrate 1. The ratio of Ar to $H_2$ in the mixture was 1:4.

The chambers 11 and 12 were evacuated to $5 \times 10^{-7}$ Torr before the introduction of the argon-hydrogen mixture. During the surface treatment process, the flow rate of the argon-nitrogen mixture was maintained at 10 sccm and the pressure in the chambers 11 and 12 was maintained at $2 \times 10^{-4}$ Torr. The output of the 2.45 GHz microwave was 400 W and the strength of the magnetic field was 875 gausses. The GaAs substrate 1 was kept at about 200° C. during the surface treatment process.

In the surface treatment, the hydrogen plasma in the ECR plasma 14 caused excessive As atoms to evaporate from the surface of the GaAs substrate 1, while the argon plasma in the ECR plasma 14 caused excessive Ga atoms to evaporate from the surface of the GaAs substrate 1. The reduction in the number of excessive As atoms decreased the $As_{Ga}$ donor state, while the reduction in the number of excessive Ga atoms decreased the $Ga_{As}$ acceptor state. As a result, the total surface state of the GaAs substrate 1 was reduced.

Figure 3B:
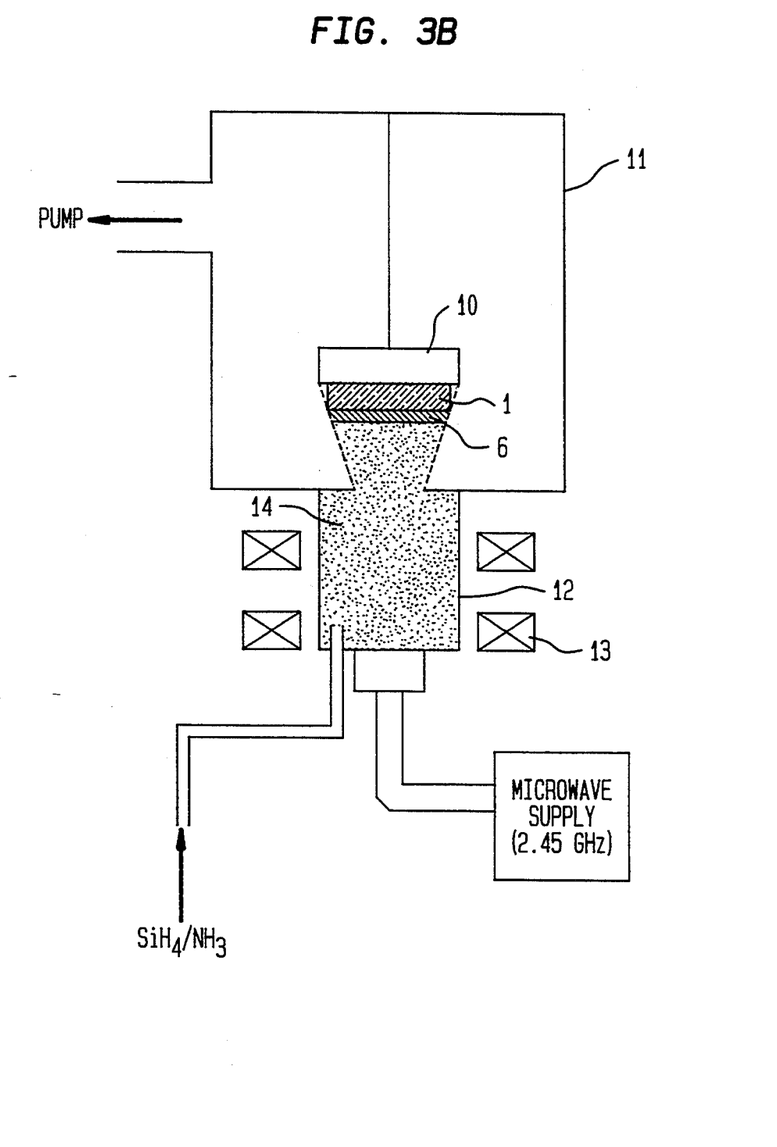
FIG. 3B is a schematic diagram showing the ECR plasma apparatus used for the formation of a gate insulating film after the surface treatment process shown in FIG. 3A.

After the surface treatment process, with the GaAs substrate 1 kept in the process chamber 11, an SiN gate insulating film 6 having a thickness of 10 to 30 nm was deposited on the GaAs substrate 1. Thus, the GaAs substrate 1 was not exposed to ambient air until the formation of the SiN gate insulating film 6 was completed. For the deposition of the SiN gate insulating film 6, instead of the argon-hydrogen mixture, a mixture of $SiH_4$ and $NH_3$ was introduced into the ECR plasma apparatus as shown in FIG. 3B, and chemical vapor deposition was performed using the $SiH_4NH_3$ mixture as the deposition gas. Thus, in this example, the surface treatment process and the formation of the SiN gate insulating film 6 were successively performed within the same apparatus. The gate insulating film 6 may be made of other materials.

Figure 4A:
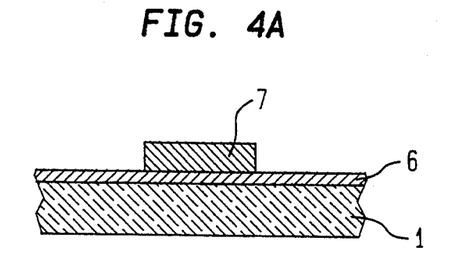
FIGS. 4A and 4B are sectional diagrams showing the steps of manufacturing an MIS-type semiconductor device, taken after the processes shown in FIGS. 3A and 3B.

Thereafter, the GaAs substrate 1 was taken out of the process chamber 11, followed by the formation of an Al gate electrode 7 on a prescribed region of the SiN film 6, as shown in FIG. 4A, using a known lift-off method. Materials such as WSi, WSiN, end WN may also be used to form the gate electrode ? . As a result of the above processing steps, an MIS structure including the gate electrode 7, the SiN film 6, and the GaAs substrate I was obtained.

Figure 4B:
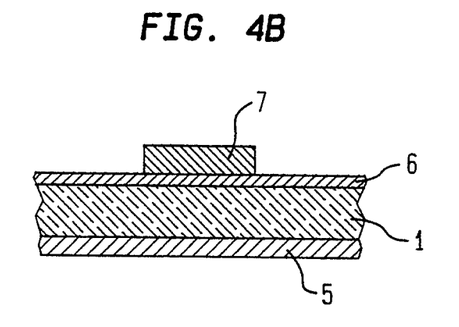

Next, the GaAs substrate 1 was annealed in an atmosphere of hydrogen at 500° C. for 15 minutes. As a result, the damage caused by the ECR plasma 14 to the GaAs substrate 1 during the surface treatment process was removed. To ensure sufficient removal of the damage, the annealing temperature should preferably be within the range of 450 to 600° C. As shown in FIG. 4B, an AuGe ohmic electrode 5 was formed on the back face of the GaAs substrate 1, thereby completing the manufacturing of an MIS-type semiconductor device.

The characteristics of the MIS-type semiconductor devices obtained in Examples 1 and 2 will now be described with reference to FIGS. 5A through 6B.

Figure 5A:
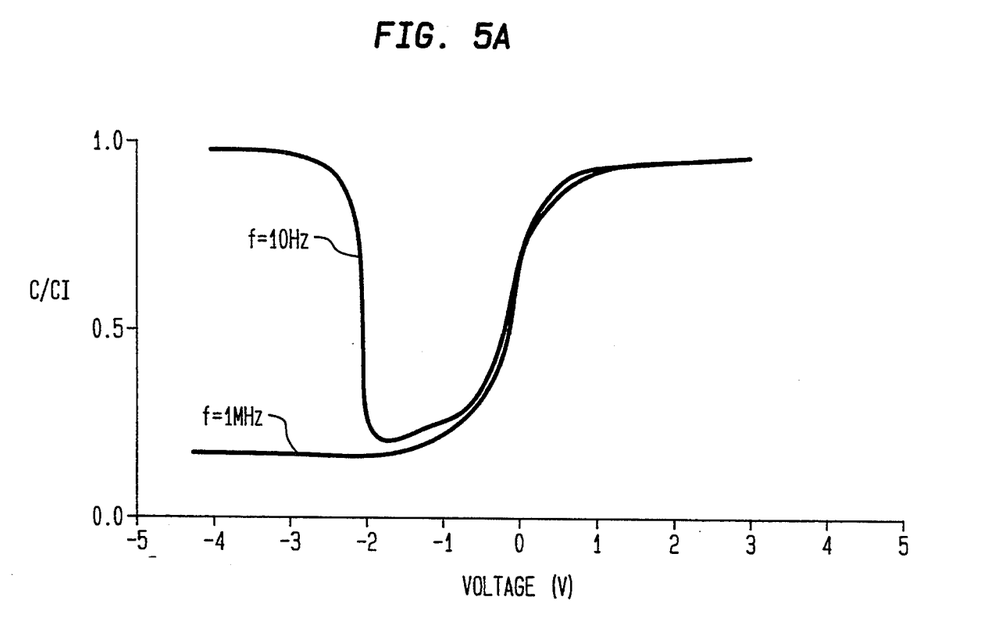
FIGS. 5A and 5B are graphs showing capacitance-voltage characteristics of MIS-type semiconductor devices manufactured by the methods illustrated in FIGS. 1 to 2C and in FIGS. 3A to 4B, respectively.
Figure 5B:
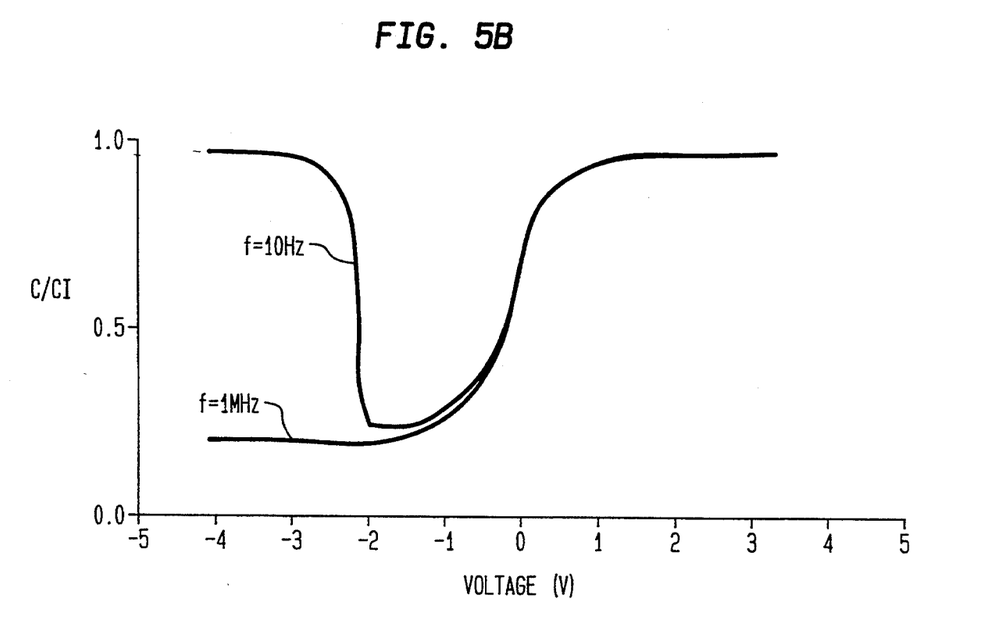

FIGS. 5A and 5B show the capacitance-voltage characteristics (C-V characteristics) of the MIS-type semiconductor devices produced in Examples 1 and 2, respectively. Specifically, the graphs (C-V curves) of FIGS. 5A and 5B each show the relationship between the bias voltage (V) and the value of MIS capacitance (C) normalized in terms of the insulator capacitance (CI). The bias voltage (V) was applied between the gate electrode 3 or 7 and the ohmic electrode Each graph shows C-V curves for the high-frequency (1 MHz) bias voltage and for the low-frequency (10 Hz) bias voltage. In both the MIS-type semiconductor devices, the area of the gate electrode was $2 \times 10^{-4}$ cm$^2$ and the carrier concentration in the n-type GaAs substrate 1 was $3 \times 10^{17}$ cm$^{-3}$. The insulator capacitance (CI) of the GaN film 2 having a thickness of 15 nm of Example 1 was 141.7 pF, while the insulator capacitance (CI) of the SiN film 6 having a thickness of 10 nm of Example 2 was 124.0 pF.

As can be seen from FIGS. 5A and 5B, both the MIS-type semiconductor devices of Examples 1 and 2 withstood the bias voltage (V) of up to about +3 volts. An inversion layer was observed in both the semiconductor devices. Also as shown by the C-V curves, there is a sudden transition from the accumulation region to the depletion region. These facts indicate that the MIS-type semiconductor devices manufactured by the method of the present invention have excellent C-V characteristics.

Figure 6A:
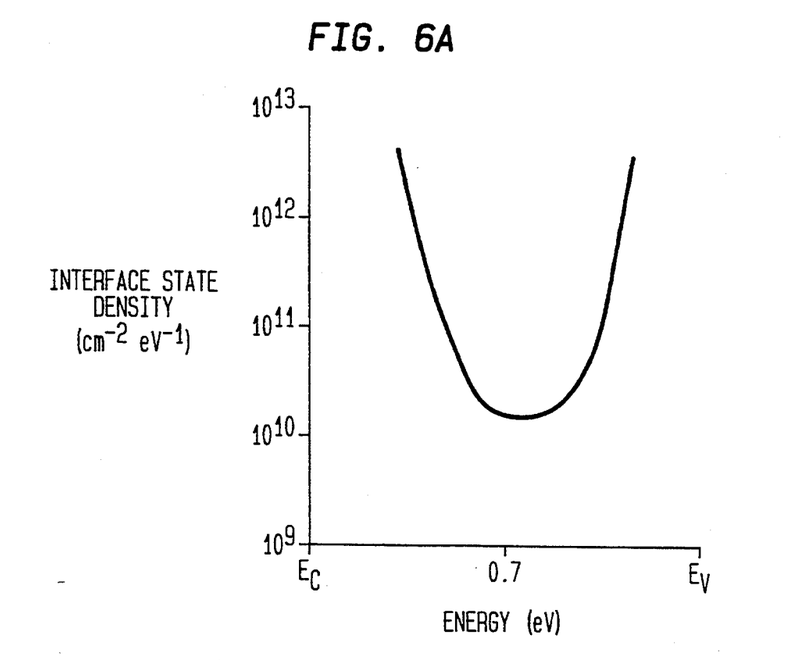
FIGS. 6A and 6B are graphs showing interface state densities of the MIS-type semiconductor devices manufactured by the methods illustrated in FIGS. 1 to 2C and in FIGS. SA to 4B, respectively.
Figure 6B:
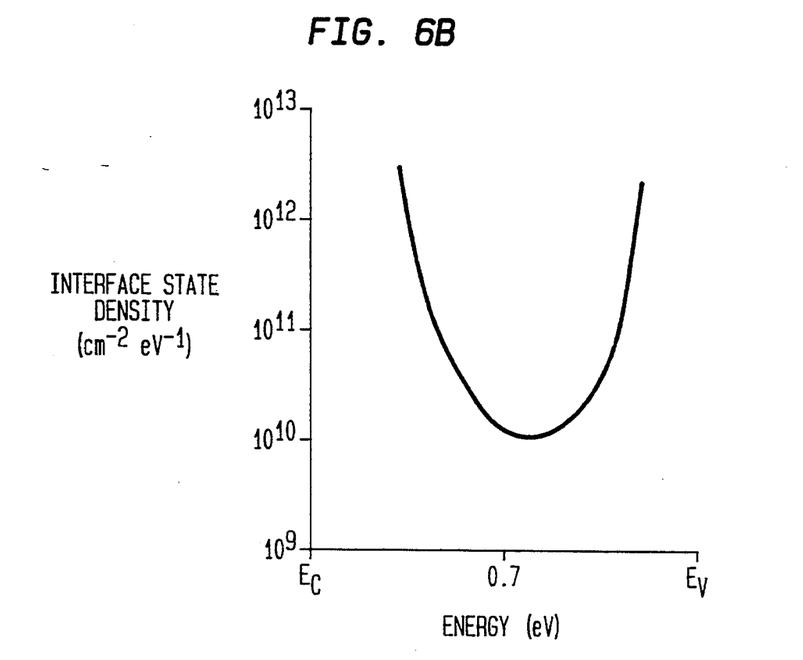

FIGS. 6A and 6B show the relationship between the interface state density and the energy level in the MIS-type semiconductor devices of Examples 1 and 2, respectively. The results were obtained by the Terman method. The minimum interface state density in both the MIS-type semiconductor devices was approximately $10^{10}$ cm$^{-2}$/eV, which was far smaller than that of an MIS-type semiconductor device manufactured by any prior art method (for example, $10^{12}$ cm$^{-2}$/eV).

In Examples 1 and 2, an n-type GaAs substrate was used, but a p-type GaAs substrate can also be used to attain the same effects. Also in Examples 1 and 2, MIS-type capacitors were manufactured, but a method of the present invention can also be applied to the manufacturing of an MIS-type transistor.

In Examples 1 and 2, the annealing process for removal of the damage caused by the plasma was performed after the formation of the gate electrode 3 or 7, but it may be performed at any stage after the surface treatment process. For example, it may be performed immediately after the surface treatment process, within the plasma apparatus in which the surface treatment had been performed.

As described above, according to the present invention, excessive As and Ga atoms in the surface portion of the GaAs substrate can be removed by surface treatment using a plasma, end furthermore, the surface of the GaAs substrate can be kept away from ambient air until the formation of the gate insulating film is completed. This makes it possible to manufacture an MIS-type semiconductor device having an excellent interface between the GaAs substrate end the gate insulating film. Furthermore, since the surface treatment is performed using a plasma, the cleaning of the GaAs substrate can be accomplished at a relatively low temperature of about 200° C. This eliminates the possibility of causing defects associated with a high-temperature process. By the use of an ECR plasma in the surface treatment process, the damage caused by the plasma to the GaAs substrate can be drastically reduced. A plasma apparatus used for generating an ECR plasma can readily be used for depositing a gate insulating film by plasma-enhanced chemical vapor deposition. Therefore, the ECR plasma apparatus is suitable for a production process in which surface treatment and the deposition of a gate insulating film are successively performed within the same apparatus.

It is understood that various other modifications will be apparent to end can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the arc to which this invention pertains.

What is claimed is:

1. A method of manufacturing an MIS-type semiconductor device, including the steps of:

introducing $N_2$ gas and $H_2$ gas into a plasma chamber; treating at least one surface of a GaAs substrate with an electron cyclotron resonance (ECR) plasma generated from both the $N_2$ gas and the $H_2$ gas which was introduced into said plasma chamber, wherein said at least one surface of the GaAs substrate surface is converted to a gallium nitride film as a result of a reaction between said GaAs substrate and said nitrogen during said step of treating said at least one surface of the GaAs substrate.

2. A method according to claim 1, further comprising the step of annealing said GaAs substrate.

3. A method according to claim 2, wherein said step of annealing said GaAs substrate is performed within the temperature range from 450° C. to 600° C.

* * * * *

UNITED STATES PATENT AND TRADEMARK OFFICE
CERTIFICATE OF CORRECTION

PATENT NO.     : 5,336,361
DATED          : August 9, 1994
INVENTOR(S)    : Akiyoshi Tamura et al.

It is certified that error appears in the above-identified patent and that said Letters Patent is hereby corrected as shown below:

Title Page, [57] Abstract, line 10 & 11, after "an" delete "healing" and insert --annealing--.

Column 2, line 67, delete "suffice" and insert --surface--.

Column 3, line 17, after "directed" delete "o" and insert --to--.

Column 3, line 18, after "substrate" delete "i" and insert --1--.

Column 3, line 46, after "substrate" delete "I" and insert --1--.

Column 3, line 50, after "as" delete "e" and insert --a--.

Column 3, line 67, delete "8" and insert --a--.

Column 5, line 6, delete "Tort" and insert --Torr--.

Column 5, line 31, delete "$SiH_4NH_3$" and insert --$SiH_4$-$NH_3$--.

Column 5, line 41, delete "end" and insert --and--.

UNITED STATES PATENT AND TRADEMARK OFFICE
CERTIFICATE OF CORRECTION

PATENT NO. : 5,336,361
DATED : August 9, 1994
INVENTOR(S) : Akiyoshi Tamura et al.

It is certified that error appears in the above-identified patent and that said Letters Patent is hereby corrected as shown below:

Column 5, line 42, delete "?" and insert --7--.

Column 5, line 45, delete "I" and insert --1--.

Column 5, line 67, after "electrode" insert --5.--.

Column 6, line 12, delete "+" and insert --±--.

Column 6, line 46, delete "end" and insert --and--.

Column 6, line 68, delete "end" and insert --and--.

Signed and Sealed this

Twenty-second Day of November, 1994

Attest:

BRUCE LEHMAN

*Attesting Officer*  *Commissioner of Patents and Trademarks*